(12) United States Patent
Song et al.

(10) Patent No.: US 8,179,707 B2
(45) Date of Patent: May 15, 2012

(54) SEMICONDUCTOR MEMORY DEVICES AND METHODS OF ARRANGING MEMORY CELL ARRAYS THEREOF

(75) Inventors: Ki-Whan Song, Yongin-si (KR); Yeong-Taek Lee, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 440 days.

(21) Appl. No.: 12/453,595

(22) Filed: May 15, 2009

(65) Prior Publication Data

US 2009/0290402 A1  Nov. 26, 2009

(30) Foreign Application Priority Data

May 23, 2008 (KR) .................. 10-2008-0048179

(51) Int. Cl.
*G11C 5/02* (2006.01)

(52) U.S. Cl. ............ 365/51; 365/72; 365/150; 365/148; 365/185.05

(58) Field of Classification Search ............ 365/51, 365/72, 148, 158, 163, 171, 173, 149, 150, 365/185.01, 185.05
See application file for complete search history.

(56) References Cited

U.S. PATENT DOCUMENTS

| | | | | |
|---|---|---|---|---|
| 5,332,923 A * | 7/1994 | Takeuchi | ............... | 257/758 |
| 5,442,212 A * | 8/1995 | Eimori | ............... | 257/303 |
| 6,403,413 B2 * | 6/2002 | Hayano et al. | ............ | 438/238 |
| 6,621,725 B2 | 9/2003 | Ohsawa | | |
| 6,903,961 B2 * | 6/2005 | Tsukikawa et al. | ......... | 365/149 |
| 7,085,156 B2 | 8/2006 | Ferrant et al. | | |
| 7,136,301 B2 * | 11/2006 | Tokumitsu | ............. | 365/184 |
| 7,177,175 B2 | 2/2007 | Fazan et al. | | |
| 7,692,957 B2 * | 4/2010 | Chang | ............... | 365/163 |
| 7,745,894 B2 * | 6/2010 | Asao et al. | .......... | 257/421 |
| 7,781,803 B2 * | 8/2010 | Nishimura et al. | ........ | 257/206 |
| 7,795,658 B2 * | 9/2010 | Shino | ............... | 257/296 |
| 7,847,332 B2 * | 12/2010 | Lee | ............... | 257/314 |
| 7,961,506 B2 * | 6/2011 | Liu | ............... | 365/163 |

(Continued)

FOREIGN PATENT DOCUMENTS

JP  2006-156986  6/2006

(Continued)

OTHER PUBLICATIONS

Hyun-Jin Cho et al. "A novel capacitor-less DRAM cell using Thin Capacitively-Coupled Thyristor (TCCT)", IEDM 2005, T-RAM.

*Primary Examiner* — Tuan T Nguyen
*Assistant Examiner* — Lance Reidlinger
(74) *Attorney, Agent, or Firm* — Harness, Dickey & Pierce (57) ABSTRACT

Semiconductor memory devices with a memory cell array including a first word line and a second word line arranged in a first direction, a source line arranged in the first direction between the first word line and the second word line, a bit line pair including a first bit line and a second bit line arranged in a second direction perpendicular to the first direction, a first memory cell including a gate connected to the first word line and first and second regions respectively connected to the second bit line and the source line, and arranged in a third direction between the first direction and the second direction, and a second memory cell including a gate connected to the second word line, a third region and the second region respectively connected to the first bit line and the source line, and arranged in the third direction.

24 Claims, 7 Drawing Sheets

U.S. PATENT DOCUMENTS

| | | |
|---|---|---|
| 2006/0091462 A1 | 5/2006 | Okhonin et al. |
| 2006/0092739 A1 | 5/2006 | Fujita et al. |
| 2006/0098481 A1 | 5/2006 | Okhonin et al. |
| 2006/0126374 A1 | 6/2006 | Waller et al. |
| 2006/0131650 A1 | 6/2006 | Okhonin et al. |
| 2007/0023833 A1 | 2/2007 | Okhonin et al. |
| 2007/0058427 A1 | 3/2007 | Okhonin et al. |
| 2007/0064489 A1 | 3/2007 | Bauser |
| 2007/0085140 A1 | 4/2007 | Bassin |
| 2007/0097751 A1 | 5/2007 | Popoff et al. |
| 2007/0138524 A1 | 6/2007 | Kim et al. |
| 2007/0138530 A1 | 6/2007 | Okhonin |

FOREIGN PATENT DOCUMENTS

| | | |
|---|---|---|
| JP | 2007-503678 | 2/2007 |
| KR | 10-0675297 | 1/2007 |

* cited by examiner

SEMICONDUCTOR MEMORY DEVICES AND METHODS OF ARRANGING MEMORY CELL ARRAYS THEREOF

PRIORITY STATEMENT

This application claims the benefit of Korean Patent Application No. 10-2008-0048179, filed May 23, 2008, the contents of which are hereby incorporated herein by reference in their entirety.

BACKGROUND

1. Field

Example embodiments relate to a semiconductor memory device, and more particularly, to a semiconductor memory device having a memory cell without a capacitor, and a method of arranging a memory cell array thereof.

2. Description of Related Art

In general, a memory cell of a dynamic semiconductor memory device includes one cell capacitor and one access transistor. Efforts have been made to increase capacity of semiconductor memory devices without increasing layout area, for example, by using dynamic memory cells having a floating body transistor without a capacitor. As a result, it is possible to fabricate improved integration density memory cells compared to conventional dynamic semiconductor memory devices. However, depending on the charge storage mechanism used (e.g., impact ionization), a device with a shared source/drain line connection (e.g., bit line) may be disturbed by an operation of another device sharing the source/drain.

SUMMARY

Example embodiments may provide a semiconductor memory device, the semiconductor memory device having zero or reduced disturbances generated between adjacent memory cells, improved integration density, and which may employ a sub-word line structure. Example embodiments may also provide a method of arranging a memory cell array of a semiconductor memory device capable of achieving the above advantages.

According to an example embodiment, a semiconductor memory device includes a memory cell array including: a word line pair including a first word line and a second word line; a source line; a bit line pair including a first bit line and a second bit line; a first memory cell oblique to the first and second word lines, including a gate and first and second regions, the gate connected to the first word line, and the first and second regions respectively connected to the second bit line and the source line; a second memory cell oblique to the first and second word lines, including a gate, a third region, and the second region, the gate connected to the second word line, and the third region connected to the first bit line.

The first region of the first memory cell may overlap the second bit line, and the third region of the second memory cell may overlap the first bit line. The first word line and the second word line of the word line pair may be electrically connected to each other.

The first memory cell may include a floating body transistor in which the first region is a drain region and the second region is a source region, and the second memory cell may include a floating body transistor in which the third region is a drain region and the second region is a source region.

The first memory cell may include a first access transistor in which the second region is a source region and a gate is connected to the first word line, and a first variable resistor is connected between a drain of the first access transistor and the first region, and the second memory cell may include a second access transistor in which the second region is a source region and a gate is connected to the second word line, and a second variable resistor connected between a drain of the second access transistor and the third region.

The first memory cell may include a first selection transistor in which the second region is a source region and a gate is connected to the first word line, and a first memory transistor is connected between a drain of the first selection transistor and the first region, and the second memory cell may include a second selection transistor in which the second region is a source region and a gate is connected to the second word line, and a second memory transistor is connected between a drain of the second selection transistor and the third region. The first and second memory transistors may include a Silicon-Oxide-Nitride-Oxide-Silicon (SONOS) cell.

The semiconductor memory device may further include a row controller configured to control the word line pair and the source lines, and a column controller configured to control the bit line pair, wherein the memory cell array may further include a sensing block including a current sense amplifier that amplifies current flowing through the first bit line and the second bit line during a read operation, or a voltage sense amplifier that amplifies voltages of the first and second bit lines.

The semiconductor memory device may further include a main word line and a main source line, wherein the main word line and the main source line are respectively connected to the word line pair and the source line.

The semiconductor memory device may further include a main word line, a main source line and a plurality of word line selection signal lines, wherein the memory cell array includes: a plurality of sub-memory cell array blocks that include the first memory cell and the second memory cell; a plurality of word line selection signal drivers connected to the corresponding word line selection signal lines; a sub-word line driver connected to an output signal line of the corresponding one of the plurality of word line selection signal drivers and the main word line, and configured to drive the word line pair; and a sub-source line driver connected to an output signal line of the corresponding one of the plurality of word line selection signal drivers and the main source line, and configured to drive the source line. The sub-word line driver and the sub-source line driver may be alternately arranged with respect to each of the plurality of sub-memory cell array blocks.

According to an example embodiment, a method of arranging a memory cell array of a semiconductor memory device includes: arranging a word line pair including a first line and a second word line in a first direction; arranging a source line in the first direction between the first and second word lines; arranging a bit line pair including a first bit line and a second bit line in a second direction perpendicular to the first direction; arranging a first memory cell including a gate connected to the first word line, and a first region and a second region respectively connected to the second bit line and the source line in a third direction between the first direction and the second direction; arranging a second memory cell including a gate connected to the second word line, and a third region and the second region respectively connected to the first bit line and the source line in the third direction; and electrically connecting the first word line to the second word line.

The first region of the first memory cell may be arranged to overlap the second bit line, and the third region of the second memory cell may be arranged to overlap the first bit line. The method may further include arranging a main word line and a main source line in the first direction, wherein the main word line and the main source line are respectively connected to the word line pair and the source line.

The method may further include arranging a main word line, a main source line and a plurality of word line selection signal lines in the first direction; arranging a plurality of sub-memory cell array blocks including the first memory cell and the second memory cell and the plurality of word line selection signal drivers connected to the corresponding word line selection signal lines in the memory cell array; and alternately arranging a sub-word line driver connected to an output signal line of the corresponding one of the plurality of word line selection signal drivers and the main word line, and configured to drive the word line pair, and a sub-source line driver connected to an output signal line of the corresponding one of the plurality of word line selection signal drivers and the main source line, and configured to drive the source line, with respect to each of the plurality of sub-memory cell array blocks.

BRIEF DESCRIPTION OF THE DRAWINGS

Example embodiments will be more clearly understood from the following brief description taken in conjunction with the accompanying drawings. FIGS. 1-8 represent non-limiting, example embodiments as described herein.

It should be noted that these Figures are intended to illustrate the general characteristics of methods, structure and/or materials utilized in certain example embodiments and to supplement the written description provided below. These drawings are not, however, to scale and may not precisely reflect the precise structural or performance characteristics of any given embodiment, and should not be interpreted as defining or limiting the range of values or properties encompassed by example embodiments. For example, the relative thicknesses and positioning of molecules, layers, regions and/or structural elements may be reduced or exaggerated for clarity. The use of similar or identical reference numbers in the various drawings is intended to indicate the presence of a similar or identical element or feature.

DETAILED DESCRIPTION OF EXAMPLE EMBODIMENTS

Example embodiments will now be described more fully with reference to the accompanying drawings, in which example embodiments are shown. Example embodiments may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements, and thus their description will be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items.

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

Figure 1:
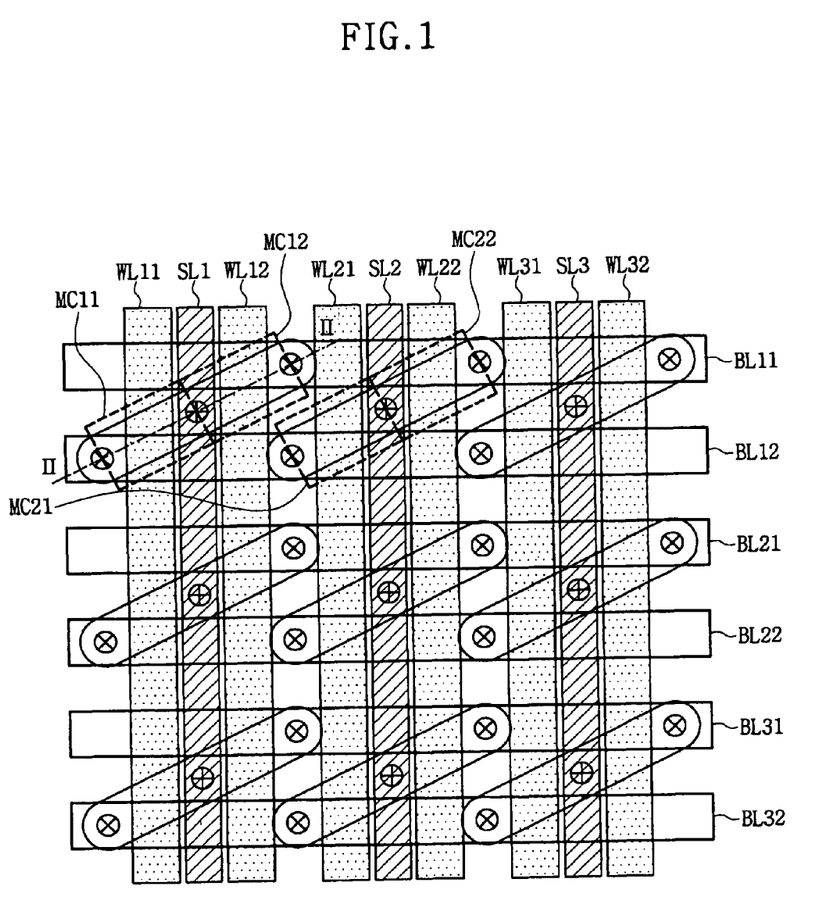
FIG. 1 is a layout diagram illustrating the arrangement of a memory cell array of a semiconductor memory device according to an example embodiment.

FIG. 1 is a layout diagram illustrating the arrangement of a memory cell array of a semiconductor memory device according to an example embodiment. Referring to FIG. 1, WL11, WL21, and WL31 denote first word lines, WL12, WL22, and WL32 denote second word lines, SL1, SL2 and SL3 denote source lines, BL11, BL21 and BL31 denote first bit lines, BL12, BL22, and BL32 denote second bit lines, MC11 and MC21 denote first memory cells and MC12 and MC22 denote second memory cells.

The semiconductor memory device and a method of arranging a memory cell array thereof will now be described with reference to FIG. 1. The first word lines WL11, WL21 and WL31 and the second word lines WL12, WL22 and WL32 may be arranged in the same direction. The source lines SL1, SL2 and SL3 each may be arranged between the first word lines WL11, WL21 and WL31 and the second word lines WL12, WL22 and WL32 in the same direction as the first and second word lines. The first bit lines BL11, BL21 and BL31 and the second bit lines BL12, BL22 and BL32 may be arranged in a direction perpendicular to the first and second word lines.

The first memory cells MC11 and MC21 may be connected to the first word lines WL11 and WL21, the second bit line BL12, and the source lines SL1 and SL2. The second memory cells MC12 and MC22 each may be connected to the second word lines WL12 and WL22, the first bit line BL11, and the source lines SL1 and SL2. The first memory cells MC11 and MC21 may be arranged in a diagonal direction between the source lines SL1 and SL2 and the second bit line BL12. The second memory cells MC12 and MC22 may be arranged in a diagonal direction between the source lines SL1 and SL2 and the first bit line BL11.

A region connected to the second bit line BL12 of each of the first memory cells MC11 and MC21 may be formed to overlap the second bit line BL12. A region connected to the first bit line BL11 of each of the second memory cells MC12 and MC22 may be formed to overlap the first bit line BL11. A region connected to the source line SL1 of the first and second memory cells MC11 and MC12 may be shared and may overlap the source line SL1. Therefore, a region connected to the bit line of the second memory cell MC12 may be separated from a region connected to the bit line of the first memory cell MC21.

The first and second word lines (WL11 and WL12), (WL21 and WL22), and (WL31 and WL32) may be configured for simultaneous activation. Although not shown in the drawing, the first and second word lines may be controlled by a row controller (not shown). The row controller may simultaneously activate the first and second word lines (WL11 and WL12), (WL21 and WL22), and (WL31 and WL32). Alternatively, the first word lines WL11, WL21, and WL31 may be electrically connected to the second word lines WL12, WL22, and WL32, respectively, so that the connected word lines may be controlled by the row controller (not shown).

For purposes of explanation, in the semiconductor memory device illustrated in FIG. 1, the first and second word lines (WL11 and WL12) and (WL21 and WL22) connected to the first and second memory cells (MC11 and MC12) and (MC21 and MC22), respectively, may be simultaneously activated according to an example embodiment. The first and second memory cells MC11 and MC12 may be connected to the source line SL1. The first and second memory cells MC21 and MC22 may be connected to the source line SL2. Therefore, since the first memory cells MC11 and MC21 may always be selected together with the second memory cells MC12 and MC22, respectively, disturbance between the memory cell pairs (MC11 and MC12) and (MC21 and MC22) may be prevented or reduced. The second memory cell MC12 and the first memory cell MC21 may be respectively connected to the first bit line BL11 and the second bit line BL12. Regions where the second memory cell MC12 and the first memory cell MC21 are respectively connected to the bit lines may be separated. Therefore, disturbance between the memory cells MC12 and MC21 may be prevented or reduced.

The integration density of the semiconductor memory device may be improved or increased by disposing the memory cells MC11, MC12, MC21 and MC22 in a diagonal direction. If the first and second word lines (WL11 and WL12) and (WL21 and WL22) connected to the first and second memory cells (MC11 and MC12) and (MC21 and MC22), respectively, are electrically connected, the number of word lines driven by the row controller (not shown) may be reduced. Therefore, the row controller (not shown) may be simplified because a sub-word line structure (e.g., hierarchical word line structure) may be employed.

Figure 2:
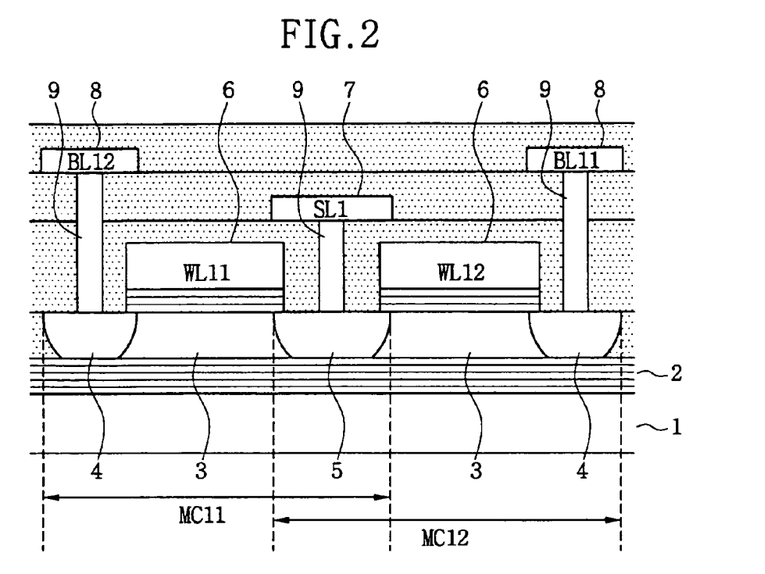
FIG. 2 is a cross-sectional view taken along line II-II of the semiconductor memory device illustrated in FIG. 1.

FIG. 2 is a cross-sectional view taken along line II-II of the semiconductor memory device illustrated in FIG. 1, in which the first memory cell MC11 and the second memory cell MC12 include floating body transistors. Referring to FIGS. 1 and 2, the memory cells MC11 and MC12 may include a substrate 1, an insulating layer 2 on the substrate 1, and drain regions 4 and a source region 5 that may be separated on the insulating layer 2. Floating body regions 3 may be between the drain regions 4 and the source region 5. Gate regions 6 may be on and separated from the floating body regions 3 by an insulating layer. The first memory cell MC11 and the second memory cell MC12 may share the source region 5. The gate regions 6 may be gate polysilicon and the gate polysilicon may become word lines WL11 and WL12. The source line SL1 may be on a layer including word lines WL11 and WL12 and insulated from the word lines WL11 and WL12. Source line SL1 may be connected to the source region 5 through a contact 9. The bit lines BL11 and BL12 may be formed above the layer in which the source line SL1 is disposed and insulated from the source line SL1. The drain region 4 of the first memory cell MC11 may be connected to the second bit line BL12 through a contact 9. The drain region 4 of the second memory cell MC12 may be connected to the first bit line BL11 through a contact 9. Each drain region 4 of the memory cells MC11 and MC12 may be adjacent to floating body regions 3. Both drain regions 4 and the floating body regions 3 may be separated from the substrate 1 by an insulator. The drain region of the second memory cell MC12 may be separated from that of the first memory cell MC21 by the floating body regions 3 and the insulating layer 2.

Figure 3:
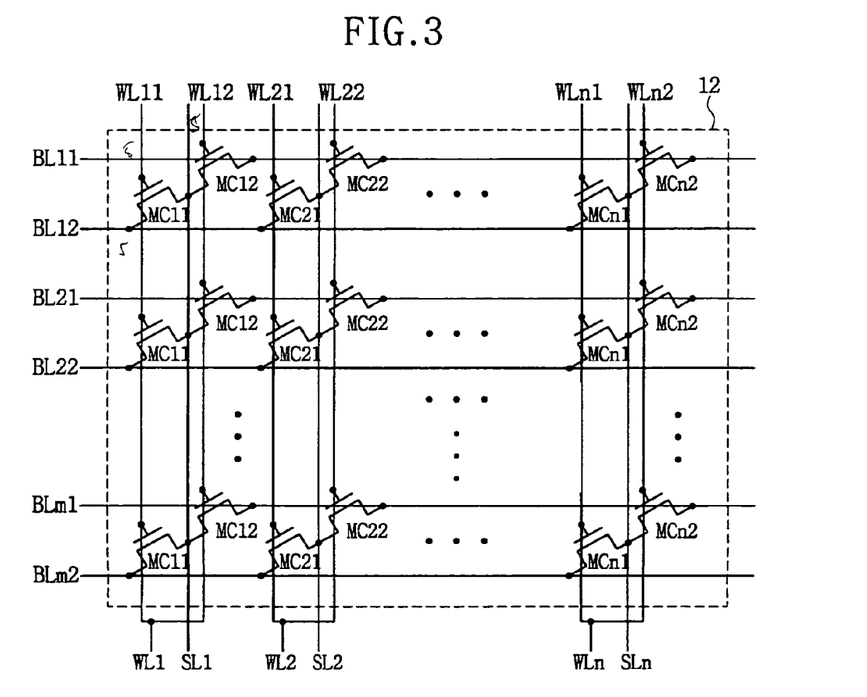
FIG. 3 is a circuit diagram illustrating a part of a memory cell array of a semiconductor memory device including memory cells with floating body transistors according to an example embodiment.

FIG. 3 is a circuit diagram illustrating a part of a memory cell array of a semiconductor memory device including memory cells with floating body transistors according to an example embodiment. In FIG. 3, a memory cell array block 12 may include the first memory cells MC11, MC21, ..., MCn1, having floating body transistors. The first memory cell floating body transistors may include gates, drains and sources connected to n first word lines WL11, WL21, ..., WLn1, m second bit lines BL12, BL22, ..., BLm2, and n (shared) source lines SL1-SLn, respectively. A memory cell array block 12 may include second memory cells MC12, MC22, ..., MCn2 having floating body transistors. The second memory cell floating body transistors may include gates, drains and sources connected to n second word lines WL12, WL22, ..., and WLn2, m first bit lines BL11, BL21, ..., and BLm1 and n (shared) source lines SL1-SLn, respectively. Note that n and m refer to any positive integer.

In FIG. 3, the first and second memory cells (MC11 and MC12), (MC21 and MC22), ..., and (MCn1 and MCn2) may be the same as the memory cell shown in FIG. 2, and the memory cell array block 12 may be arranged as the same as the cell array block illustrated in FIG. 1. The memory cells may, for example, write or read data using bipolar junction transistor characteristics of floating body transistors. However, example embodiments are not limited thereto.

A semiconductor memory device according to an example embodiment will now be described with reference to FIG. 3. The first word lines WL11, WL21, ..., and WLn1 and the second word lines WL12, WL22, ..., and WLn2 of the memory cell array block 12 of the semiconductor memory device may be arranged in the same direction. The source lines SL1, SL2, ..., and SLn may be arranged between the first and second word lines (WL11 and WL12), (WL21 and WL22), ..., and (WLn1 and WLn2), respectively, in the same direction as the word lines. The first bit lines and second bit lines BL11, BL12, BL21, BL22, ..., BLm1, and BLm2 may be arranged in a direction perpendicular to the word lines. Gates of the first memory cells MC11, MC21, ..., and MCn1 may be connected to corresponding first word lines WL11, WL21, ..., and WLn1, respectively, and gates of the second memory cells MC12, MC22, ..., and MCn2 may be connected to the corresponding second word lines WL12, WL22, ..., and WLn2, respectively. Sources of the first and second memory cells (MC11 and MC12), (MC21 and MC22), ..., and (MCn1 and MCn2) may be shared and may be connected to the source lines SL1, SL2, ..., and SLn, respectively. Drains of the first memory cells MC11, MC21, ..., and MCn1 may be connected to the corresponding second bit lines BL12, BL22, ..., and BLm2, respectively, and drains of the second memory cells MC12, MC22, ..., and MCn2 may be connected to the corresponding first bit lines BL11, BL21, ..., and BLm1, respectively. The drains of the memory cells MC11, MC12, MC21, MC22, ..., MCn1, and MCn2 may be separated from each other as illustrated in FIGS. 1 and 2. The first and second word lines (WL11 and WL12), (WL21 and WL22), ..., and (WLn1 and WLn2) may be electrically connected to the corresponding word lines WL1, WL2, ..., and WLn, and the word lines WL1, WL2, ..., and WLn may be controlled by a row controller (not shown).

Methods of operating memory blocks according to example embodiments will now be described with reference to FIG. 3. The memory cell array block 12 may write and/or read data using individual memory cells. Individual memory cells may be written and/or read from by selecting one of the word lines WL1, WL2, ..., and WLn, selecting one of the source lines SL1, SL2, ..., and SLn, and selecting one of the first bit lines and/or the second bit lines BL11, BL12, BL21, BL22, ..., and BLm1, and BLm2. Each of the first and second memory cells (MC11 and MC12), (MC21 and MC22), ..., (MCn1 and MCn2) may be selected by selecting their corresponding word and source lines and may be selected to receive and/or output data through their corresponding first bit line and/or second bit line. According to an example embodiment, the corresponding first bit line and/or the second bit line may prevent data from being input or output to/from a memory cell selected by the corresponding word and source lines.

The first and second memory cell pairs (MC11 and MC12), (MC21 and MC22), ..., and (MCn1 and MCn2) may be connected to the same source line and the connected word lines may be electrically connected to each other so that the first and second memory cell pairs may always be selected together. Therefore, disturbances that may be generated between the first and second memory cells (MC11 and MC12), (MC21 and MC22), ..., and (MCn1 and MCn2) may be prevented or reduced. According to an example embodiment and referring to first and second memory cell pairs (MC11 and MC12) and (MC21 and MC22), the drain of the second memory cell MC12 may be separated from that of the first memory cell MC21. The drains of the second memory cells and those of the first memory cells may be connected to the first bit lines BL11, BL21, ..., and BLm1 and the second bit lines BL12, BL22, ..., and BLm2, respectively. Therefore, disturbance that may be generated between neighboring memory cells connected to the same drain may be prevented by using separate drains according to an example embodiment. Although example embodiments are described with respect to the drain, this is descriptive, and either the source and/or the drain may be separated as dictated by the charge storing mechanism.

Figure 4:
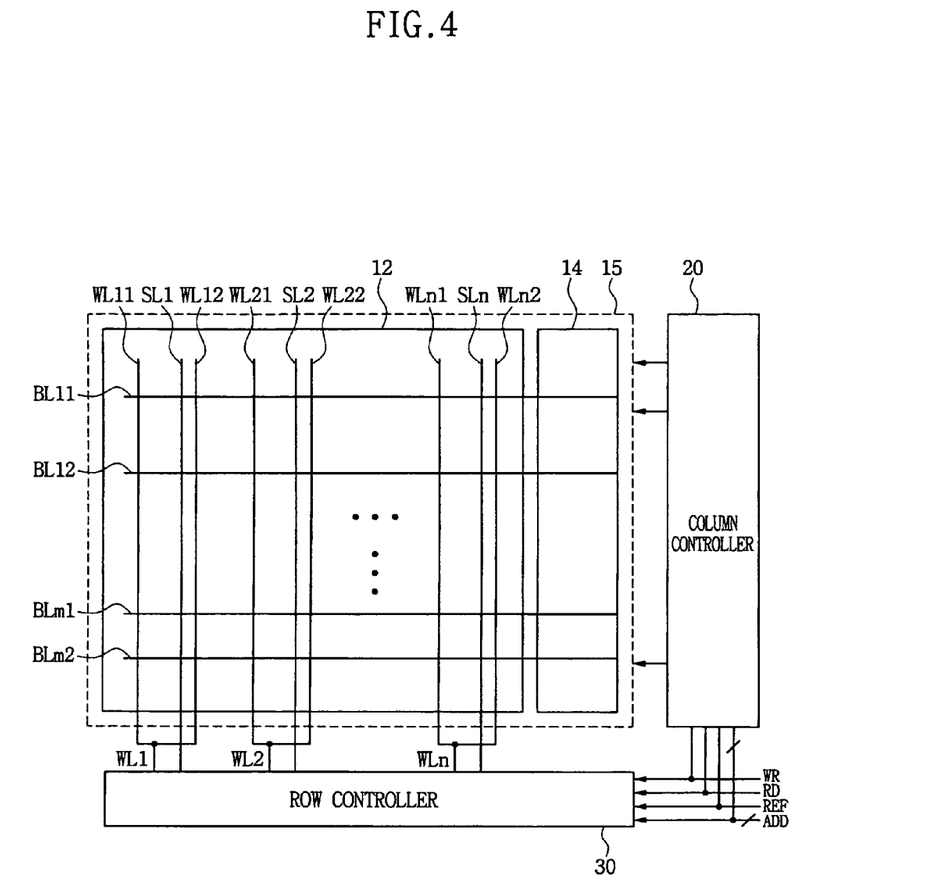
FIGS. 4-6 are schematics illustrating configurations of semiconductor memory devices according to example embodiments.

FIG. 4 is a schematic illustrating the configuration of a semiconductor memory device according to an example embodiment. Referring to FIG. 4, the semiconductor memory device may include a memory cell array 15, a column controller 20, and a row controller 30. The memory cell array 15 may include a memory cell array block 12 and a sensing block 14, (although according to an example embodiment, the memory cell array 15 may include a plurality of memory cell array blocks and a plurality of sensing blocks). In FIG. 4, WL11, WL21, ..., and WLn1, denote first word lines and WL12, WL22, ..., and WLn2, denote second word lines. SL1, SL2, ..., and SLn, denote source lines, BL11, BL21, ..., and BLm1, denote first bit lines and BL12, BL22, ..., and BLm2, denote second bit lines. The first and second word lines (WL11 and WL12), (WL21 and WL22), ..., and (WLn1 and WLn2) may be electrically connected to the corresponding respective word lines WL1, WL2, ..., WLn.

Methods of operating a semiconductor memory device according to example embodiments will now be described with reference to FIG. 4. The memory cell array block 12 may have the same configuration as example embodiments illustrated in FIGS. 1-3 and may write and/or read data through a selected memory cell. The sensing block 14 may include a current sense amplifier and/or a voltage sense amplifier to amplify a current or voltage difference between the first and second bit lines BL11, BL12, ..., BLm1, and BLm2. The row controller 30 may control the word lines WL1, WL2, ..., and WLn and/or the source lines SL1, SL2, ..., and SLn to select memory cells in response to a write signal WR and/or a read signal RD and/or an address signal ADD. In response to a refresh command REF, the controller may control the word lines WL1, WL2, ..., and WLn and the source lines SL1, SL2, ..., and SLn to refresh the memory cells. The column controller 20 may control the first and second bit lines BL11, BL12, BL21, BL22, ..., BLm1, and BLm2, in response to the write signal WR and/or the read signal RD and/or the address signal ADD to write and/or read data to/from the selected memory cells and/or to prevent data from being written or read to/from undesired memory cells. Furthermore, the column controller 20 may control the first and second bit lines BL11, BL12, BL21, BL22, . . . , BLm1, and BLm2, in response to the refresh command REF to refresh the memory cells. An address signal applied to the row controller 30 may be a row address and an address signal applied to the column controller 20 may be a column address.

As illustrated in FIG. 4, semiconductor memory cells according to an example embodiment may prevent and/or reduce disturbance between memory cells and the number of word lines driven by the row controller 30 may be reduced, which may reduce the space/area required for implementing a word line drive circuit in the row controller 30.

Figure 5:
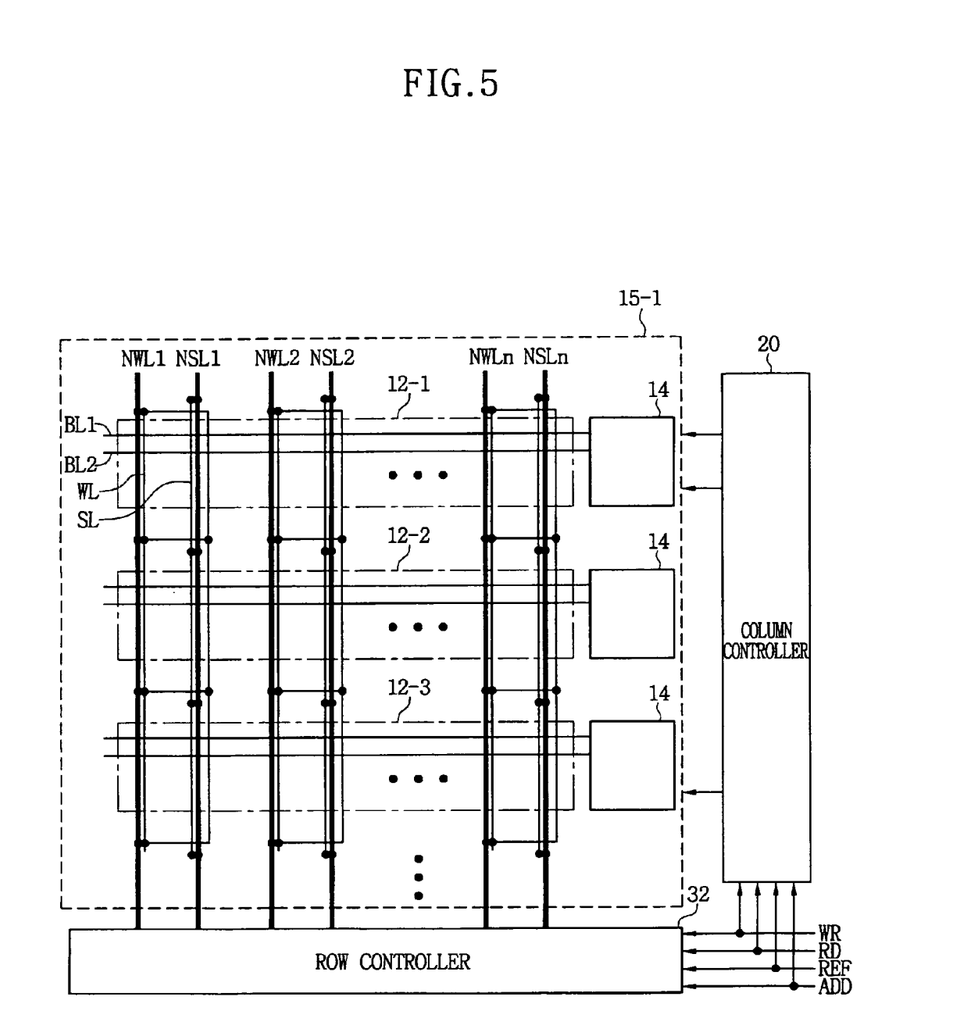

FIG. 5 is a schematic illustrating a configuration of a semiconductor memory device according to an example embodiment. The semiconductor memory device according to an example embodiment illustrated in FIG. 5 may be the same to that illustrated in FIG. 4 except that it has a word line strap structure in order to reduce a load on the word line (e.g., polysilicon lines connected to metal lines). Referring to FIG. 5, the semiconductor memory device may include a memory cell array 15-1, a column controller 20, and a row controller 32. The memory cell array 15-1 may include a plurality of sub-memory cell array blocks 12-1, 12-2, 12-3 . . . , and a plurality of sensing blocks 14. In FIG. 5, NWL1, NWL2, . . . , and NWLn, denote main word lines and NSL1, NSL2, . . . , and NSLn, denote main source lines. Each of the plurality of sub-memory cell array blocks 12-1, 12-2, . . . may be configured the same as the elements illustrated in FIGS. 1-3 and may write and/or read data through a selected memory cell. The memory cell array 15-1 may function the same as the memory cell array 15 described with reference to FIG. 4. The sensing blocks 14 and the column controller 20 may operate the same as described with reference to FIG. 4. Referring to FIGS. 1-5, the main word lines NWL1, NWL2, . . . , and NWLn, and the main source lines NSL1, NSL2, . . . , and NSLn, may be metal lines and may be connected to corresponding word line pairs (WL11 and WL12), (WL21 and WL22), . . . , and (WLn1 and WLn2), and to corresponding source lines SL1, SL2, . . . , and SLn, respectively.

Methods of operating the semiconductor memory device illustrated in FIG. 5 will now be described. The row controller 32 may control the main word lines NWL1, NWL2, . . . , and NWLn and the main source lines NSL1, NSL2, . . . , and NSLn in response to a write signal WR and/or a read signal RD and/or an address signal ADD to select a memory cell. The row controller 32 may control the main word lines NWL1, NWL2, . . . , and NWLn and the main source lines NSL1, NSL2, . . . , and NSLn in response to a refresh command REF to refresh the memory cells.

Figure 6:
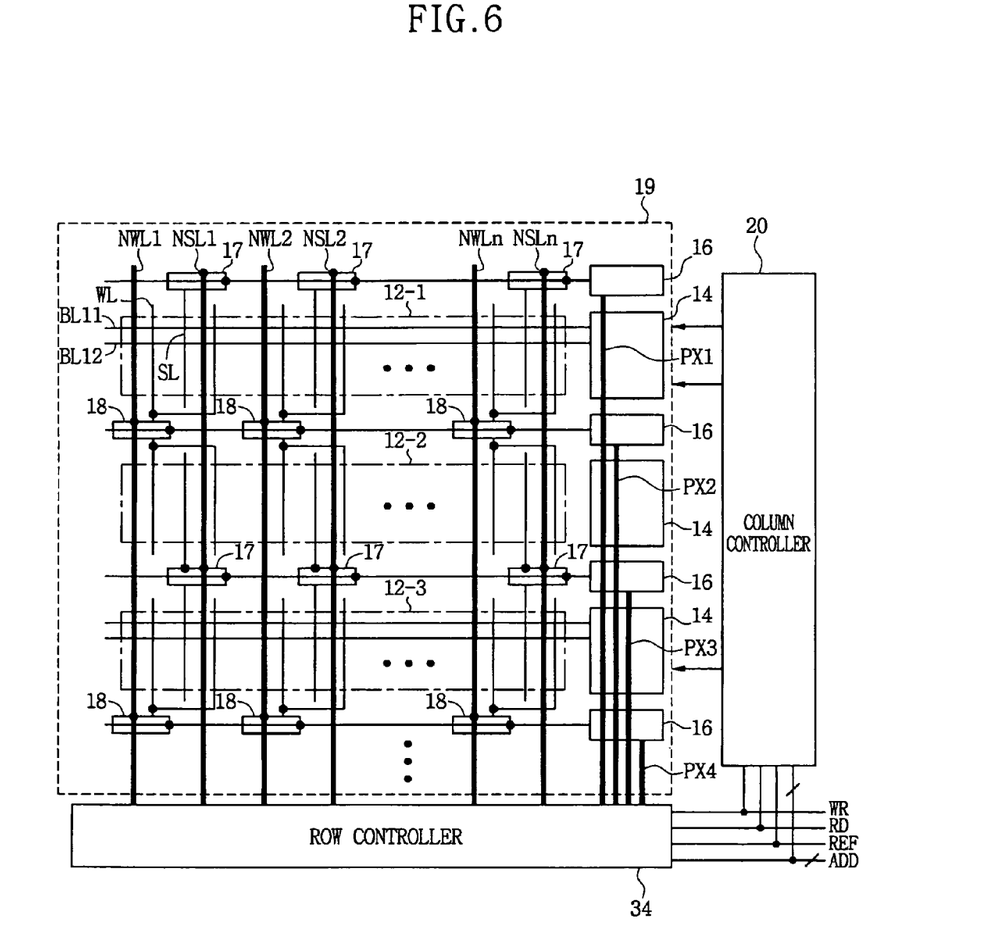

FIG. 6 is a schematic illustrating a configuration of a semiconductor memory device according to an example embodiment. Referring to FIG. 6, the semiconductor memory device may include a memory cell array 19, a column controller 20, and a row controller 34. The memory cell array 19 may include a plurality of sub-memory cell array blocks 12-1, 12-2, . . . , a plurality of word line selection signal drivers 16, a plurality of sensing blocks 14, a plurality of sub-source line drivers 17 and a plurality of sub-word line drivers 18. In FIG. 6, WL denotes sub-word line pairs, SL denotes sub-source lines, BL11, . . . denote first bit lines, BL12, . . . denote second bit lines, NWL1, NWL2, . . . , and NWLn denote main word lines, NSL1, NSL2, . . . , and NSLn denote main source lines, and PX1, PX2, . . . denote word line selection signal lines. The sub-word lines connected to gates of every two adjacent memory cells (i.e., a first memory cell and a second memory cell) may be electrically connected to each other to constitute the sub-word line pairs WL.

Each of the plurality of sub-memory cell array blocks 12-1, 12-2, . . . may be configured the same as illustrated in FIGS. 1-3 and may write and/or read data through a selected memory cell. Each of the plurality of sensing blocks 14 may include a current sense amplifier and/or a voltage sense amplifier to amplify a current or voltage difference between the bit lines. Each of the plurality of word line selection signal drivers 16 may drive and/or output a signal of the corresponding word line selection signal lines. The plurality of sub-source line drivers 17 may be connected to the corresponding main source lines NSL1, NSL2, . . . , and NSLn, and output signal lines of the corresponding word line selection signal drivers 16, respectively, and may drive the corresponding sub-source lines SL. The plurality of sub-word line drivers 18 may be connected to corresponding main word lines NWL1, NWL2, . . . , and NWLn and output signal lines of the corresponding word line selection signal drivers 16, respectively, and drive the corresponding sub-word line pairs WL. Further, the sub-source line drivers 17 and the sub-word line drivers 18 may be alternately disposed above and below each of the sub-memory cell array blocks 12-1, 12-2, . . . .

Methods of operating the semiconductor memory device illustrated in FIG. 6 will now be described. The row controller 34 may control the main word lines NWL1, NWL2, . . . , and NWLn, the main source lines NSL1, NSL2, . . . , and NSLn, and/or the word line selection signal lines PX1, PX2, . . . in response to a write signal WR and/or a read signal RD and/or an address signal ADD to select a memory cell. The row controller 34 may control the main word lines NWL1, NWL2, . . . , and WLn, and the main source lines NSL1, NSL2, . . . , and NSLn in response to a refresh command REF to refresh the memory cells. The column controller 20 may function the same as described in FIG. 4. An address signal applied to the row controller 34 may be a row address and an address signal applied to the column controller 20 may be a column address.

The semiconductor memory device illustrated in FIG. 6 according to an example embodiment may employ a sub-word line driver structure. In a conventional semiconductor memory device, where the number of driven word lines (or sub-word lines) may be increased as compared to an example embodiment, the number of required sub-word line drivers may also be increased. Limited space for installing sub-word line drivers in a conventional semiconductor memory device has resulted in a case where a sub-word line driver structure has been seldom employed. However, in a semiconductor memory device according to an example embodiment, the sub-word lines may connect to gates of every two adjacent memory cells and may be electrically connected to each other to constitute the sub-word line pairs WL. The number of required sub-word line drivers 18 may be reduced by half and may overcomes or reduce the space limitations in a memory cell array 19 in order to facilitate the use of a sub-word line driver structure.

Example embodiments describe a memory cell in a memory cell array of a semiconductor memory device including a floating body transistor. According to example embodiments, a semiconductor memory device having a memory cell that conventionally does not have a capacitor (e.g., a memory cell employing a variable resistor as a data storage element or a flash memory) is also described.

Figure 7:
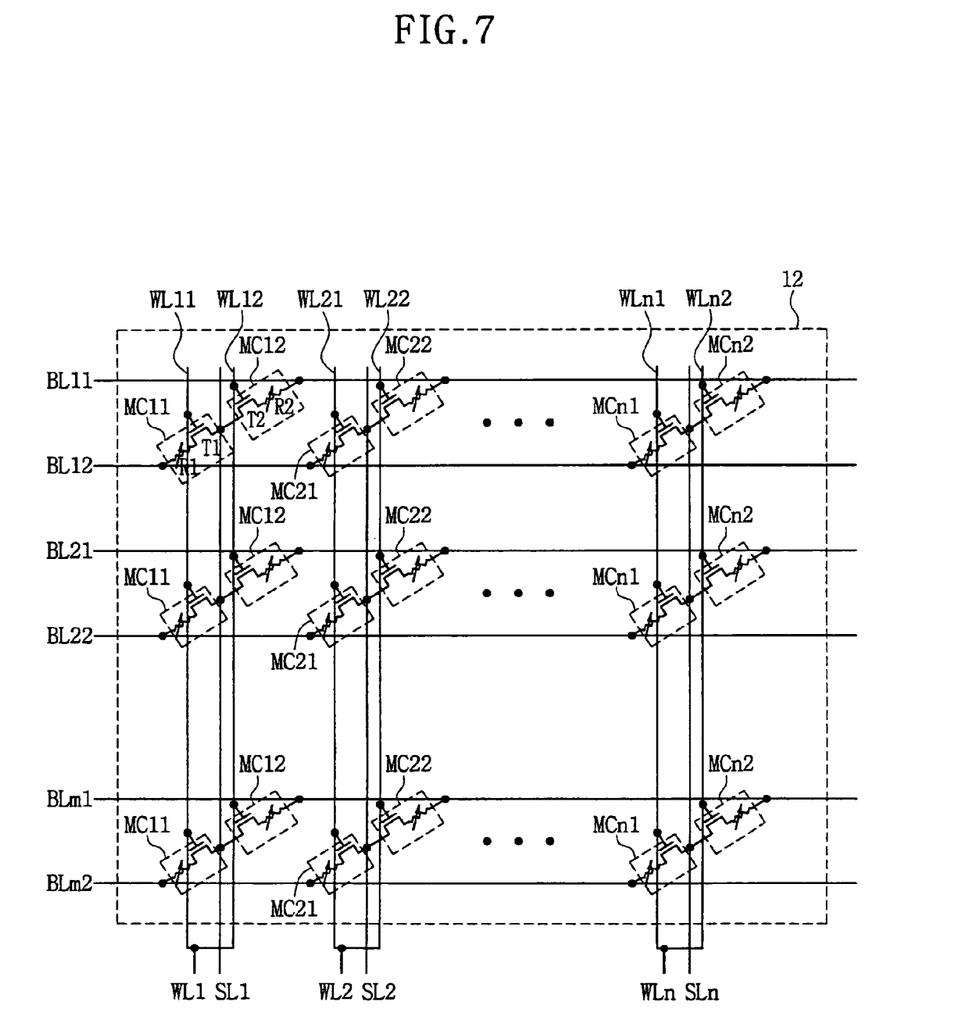
FIG. 7 is a circuit diagram illustrating a part of a memory cell array of a semiconductor memory device including memory cells with variable resistors according to an example embodiment.

FIG. 7 is a circuit diagram illustrating a part of a memory cell array of a semiconductor memory device including memory cells in which a variable resistor is employed as a data storage element according to an example embodiment.

The semiconductor memory device illustrated in FIG. 7 may be the same as illustrated in FIGS. 1 and 4-6 except for the following differences. Each of the plurality of first memory cells MC11, MC21, ..., and MCn1, may include a first access transistor T1 including a gate connected to a corresponding one of the plurality of first word lines WL11, WL21, ... and WLn1, a source connected to a corresponding one of the plurality of source lines SL1, SL2, ..., and SLn, and a first variable resistor R1 connected between the drain of the first access transistor T1 and a corresponding one of the plurality of second bit lines BL12, BL22, ..., and BLm2. Each of the plurality of second memory cells MC11, MC21, ..., and MCn1, may include a second access transistor T2 including a gate connected to the corresponding one of the plurality of second word lines WL12, WL22, ..., and WLn2, a source connected to the corresponding one of the plurality of source lines SL1, SL2, ..., and SLn, and a second variable resistor R2 that may be connected between a drain of the second access transistor T2 and a corresponding one of the plurality of first bit lines BL11, BL21, ..., and BLm1. Referring to FIG. 7, each memory cell may be a phase change memory cell, resistance RAM (RRAM) or magnetic RAM (MRAM).

Figure 8:
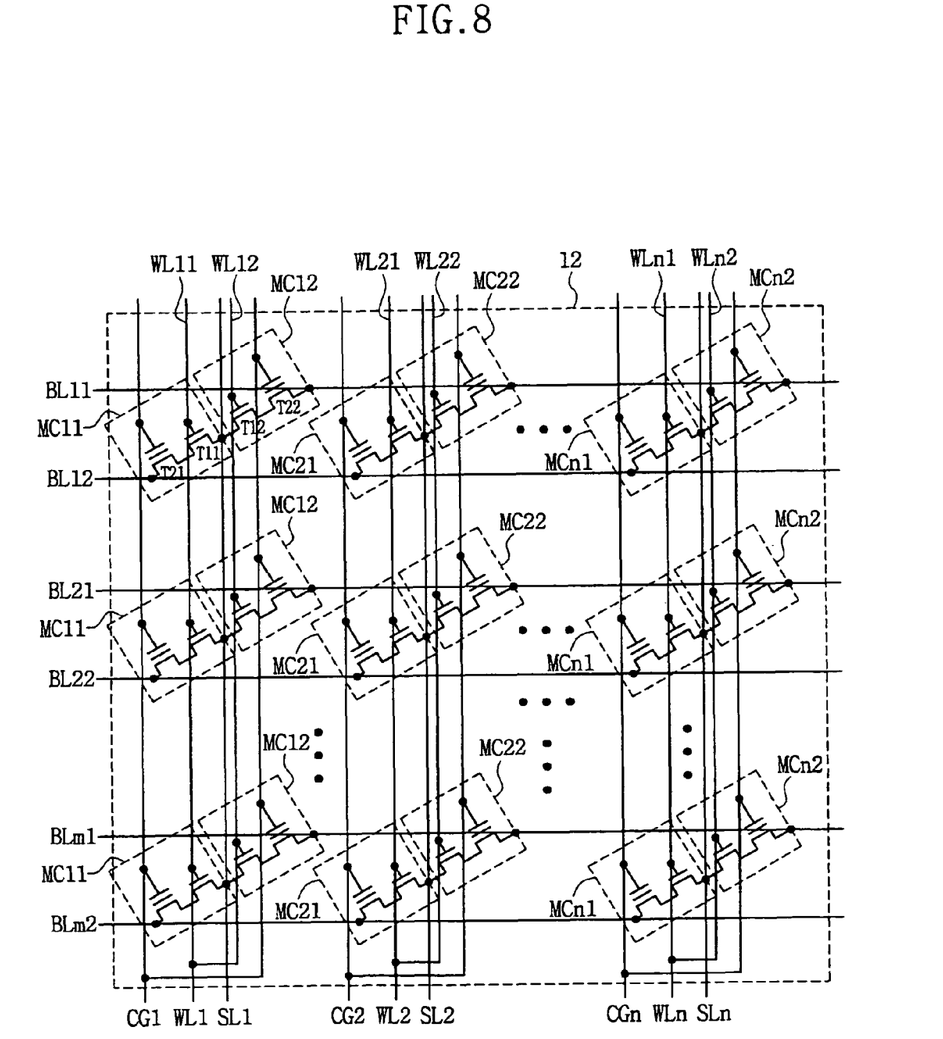
FIG. 8 is a circuit diagram illustrating a part of a memory cell array of a flash memory device according to an example embodiment.

FIG. 8 is a circuit diagram illustrating a part of a memory cell array of a flash memory device according to an example embodiment. According to an example embodiment, the semiconductor memory device illustrated in FIG. 8 may be the same as that illustrated in FIGS. 1 and 4-6 except as follows. Each of the plurality of first memory cells MC11, MC21, ..., and MCn1, may include a first selection transistor T11 including a gate connected to a corresponding one of the plurality of first word lines WL11, WL21, ..., and WLn1, a source connected to a corresponding one of the plurality of source lines SL1, SL2, ..., and SLn, and a first memory transistor T21 that is connected between a drain of the first selection transistor T11 and a corresponding one of the plurality of second bit lines BL12, BL22, ..., and BLm2, the first memory transistor T21 including a gate connected to a corresponding one of the plurality of control gate lines CG1, CG2, ..., CGn. Each of the plurality of second memory cells MC12, MC22, ..., and MCn2 may include a second selection transistor T12 including a gate connected to a corresponding one of the plurality of second word lines WL12, WL22, ..., and WLn2, a source connected to the corresponding one of the plurality of source lines SL1, SL2, ..., and SLn, and a second memory transistor T22 that is connected between the drain of the second selection transistor T12 and a corresponding one of the plurality of first bit lines BL11, BL21, ..., and BLm1, the second memory transistor T22 including a gate connected to a corresponding one of the plurality of control gate lines CG1, CG2, ..., CGn. Each of the first memory transistors T21 and the second memory transistors T22 may be formed of a Silicon-Oxide-Nitride-Oxide-Silicon (SONOS) cell in which silicon oxide, silicon nitride, and silicon oxide are sequentially stacked between a gate and a substrate.

According to an example embodiment, a region connected to a bit line of a second memory cell MC12 may be connected to a first bit line by overlapping the first bit line. A region connected to a bit line of a first memory cell MC21 may be connected to a second bit line by overlapping the second bit line. Thus, the regions that are connected to bit lines of the second and first memory cells MC12 and MC21 may be separated from each other. Further, the word and source lines that may be connected to the first and second memory cells MC11 and MC12 may be simultaneously activated. Consequently, a disturbance that may occur between memory cells may be prevented or reduced. Moreover, the memory cells may be disposed in a diagonal direction to enhance integration density of a semiconductor memory device.

According to an example embodiment in which word lines (or sub-word lines) may be connected to the first and second memory cells MC11 and MC12, and may be electrically connected to each other, the number of word lines driven by a row controller may be reduced and a layout area of the row controller may be reduced. The number of required sub-word line drivers may be reduced, facilitating the use of a sub-word line driver structure.

Accordingly, a semiconductor memory device and a method of arranging a memory cell array thereof are may prevent or reduce disturbance between adjacent memory cells, improve integration density of the semiconductor memory device, and employ a sub-word line structure.

While example embodiments have been particularly shown and described, it will be understood by one of ordinary skill in the art that variations in form and detail may be made therein without departing from the spirit and scope of the claims.

What is claimed is:

1. A semiconductor memory device comprising a memory cell array, the memory cell array comprising:
    a word line pair including a first word line and a second word line that are electrically connected to each other;
    a source line;
    a bit line pair including a first bit line and a second bit line;
    a first memory cell oblique to the first and second word lines, including a gate and first and second regions, the gate connected to the first word line, and the first and second regions respectively connected to the second bit line and the source line; and
    a second memory cell oblique to the first and second word lines, including a gate, a third region, and the second region, the gate connected to the second word line, the third region connected to the first bit line,
    wherein the first word line and the second word line are configured so that the first word line and the second word line may be simultaneously activated.

2. The semiconductor memory device of claim 1, wherein the word line pair are arranged in a first direction,
    the source line is arranged in the first direction between the first word line and the second word line,
    the bit line pair is arranged in a second direction perpendicular to the first direction, and
    the first and second memory cells are arranged in a third direction between the first and second directions.

3. The semiconductor memory device of claim 1, wherein the first region of the first memory cell overlaps the second bit line, and
    the third region of the second memory cell overlaps the first bit line.

4. The semiconductor memory device of claim 1, wherein the first memory cell includes a floating body transistor in which the first region is a drain region and the second region is a source region, and
    the second memory cell includes a floating body transistor in which the third region is a drain region and the second region is a source region.

5. The semiconductor memory device of claim 4, further comprising:
    a row controller configured to control the word line pair and the source line; and
    a column controller configured to control the bit line pair,
    wherein the memory cell array further comprises a sensing block including a current sense amplifier configured to amplify current flowing through the first bit line and the second bit line during a read operation.

6. The semiconductor memory device of claim 4, further comprising:
a row controller configured to control the word line pair and the source line; and
a column controller configured to control the bit line pair,
wherein the memory cell array further comprises a voltage sense amplifier configured to amplify voltage of the first bit line and the second bit line during a read operation.

7. The semiconductor memory device of claim 4, further comprising:
a main word line connected to the word line pair; and
a main source line connected to the source line.

8. The semiconductor memory device of claim 7, further comprising:
a row controller configured to control the main word line and the main source line; and
a column controller configured to control the bit line pair,
wherein the memory cell array further comprises a sensing block having a current sense amplifier configured to amplify current flowing through the first bit line and the second bit line during a read operation.

9. The semiconductor memory device of claim 7, further comprising:
a row controller configured to control the main word line and the main source line; and
a column controller configured to control the bit line pair,
wherein the memory cell array further comprises a sensing block having a voltage sense amplifier configured to amplify voltage of the first bit line and the second bit line during a read operation.

10. The semiconductor memory device of claim 4, further comprising:
a main word line;
a main source line; and
a plurality of word line selection signal lines,
wherein the memory cell array further comprises, a plurality of sub-memory cell array blocks that include the first memory cell and the second memory cell,
a plurality of word line selection signal drivers connected to the corresponding word line selection signal lines,
a sub-word line driver connected to an output signal line of the corresponding one of the plurality of word line selection signal drivers and the main word line, and configured to drive the word line pair, and
a sub-source line driver connected to an output signal line of the corresponding one of the plurality of word line selection signal drivers and the main source line, and configured to drive the source line.

11. The semiconductor memory device of claim 10, wherein the sub-word line driver and the sub-source line driver are alternately arranged with respect to each of the plurality of sub-memory cell array blocks.

12. The semiconductor memory device of claim 11, further comprising:
a row controller configured to control the main word line, the main source line, and the plurality of word line selection signal lines; and
a column controller configured to control the first bit line and the second bit line,
wherein the memory cell array further comprises a sensing block including a current sense amplifier that amplifies current flowing through the first bit line and the second bit line during a read operation.

13. The semiconductor memory device of claim 11, further comprising:
a row controller configured to control the main word line, the main source line, and the plurality of word line selection signal lines; and
a column controller configured to control the bit line pair,
wherein the memory cell array further comprises a sensing block including a voltage sense amplifier that amplifies voltage of the first bit line and the second bit line during a read operation.

14. The semiconductor memory device of claim 1, wherein the first memory cell includes a first access transistor in which the second region is a source region and a gate is connected to the first word line, and a first variable resistor is connected between a drain of the first access transistor and the first region, and
the second memory cell includes a second access transistor in which the second region is a source region and a gate is connected to the second word line, and a second variable resistor is connected between a drain of the second access transistor and the third region.

15. The semiconductor memory device of 1, wherein the first memory cell includes a first selection transistor in which the second region is a source region and a gate is connected to the first word line, and a first memory transistor is connected between a drain of the first selection transistor and the first region, and
the second memory cell includes a second selection transistor in which the second region is a source region and a gate is connected to the second word line, and a second memory transistor is connected between a drain of the second selection transistor and the third region.

16. The semiconductor memory device of claim 15, wherein each of the first and second memory transistors includes a Silicon-Oxide-Nitride-Oxide-Silicon (SONOS) cell.

17. A method of arranging a memory cell array of a semiconductor memory device, comprising:
arranging a word line pair including a first word line and a second word line that are electrically connected to each other in a first direction;
arranging a source line in the first direction between the first and second word lines;
arranging a bit line pair including a first bit line and a second bit line in a second direction perpendicular to the first direction;
arranging a first memory cell including a gate connected to the first word line, and first and second regions respectively connected to the second bit line and the source line, in a third direction between the first direction and the second direction; and
arranging a second memory cell including a gate connected to the second word line, and a third region and the second region respectively for connecting to the first bit line and the source line, in the third direction.

18. The method of arranging a memory cell array of a semiconductor memory device of claim 17, wherein arranging the first memory cell includes arranging the first region to overlap the second bit line, and
arranging the second memory cell includes arranging the third region to overlap the first bit line.

19. The method of arranging a memory cell array of a semiconductor memory device of claim 18, further comprising:
arranging a main word line in the first direction; and
arranging a main source line in the first direction, wherein arranging the main word line and the main source line includes respectively connecting the main word line and the main source line to the word line pair and the source line.

20. The method of arranging a memory cell array of a semiconductor memory device of claim 18, further comprising:
arranging a main word line in the first direction;
arranging a main source line in the first direction;
arranging a plurality of word line selection signal lines in the first direction;
arranging a plurality of sub-memory cell array blocks including the first memory cell and the second memory cell, and a plurality of word line selection signal drivers for connecting to the corresponding word line selection signal lines in the memory cell array; and
alternately arranging a sub-word line driver, connected to an output signal line of the corresponding one of the plurality of word line selection signal drivers and the main word line and configured to drive the word line pair, and a sub-source line driver connected to an output signal line of the corresponding one of the plurality of word line selection signal drivers and the main source line and configured to drive the source line, with respect to each of the plurality of sub-memory cell array blocks.

21. The method of arranging a memory cell array of a semiconductor memory device of claim 18, wherein arranging the first and second memory cells further includes arranging the first memory cell including a floating body transistor in which the first region is a drain region and the second region is a source region, and
arranging the second memory cell including a floating body transistor in which the third region is a drain region and the second region is a source region.

22. The method of arranging a memory cell array of a semiconductor memory device of claim 18, wherein arranging the first memory cell further includes arranging a first access transistor in which the second region is a source region and a first variable resistor, by connecting a gate of the first access transistor to the first word line and connecting the first variable resistor between a drain of the first access transistor and the first region, and
arranging the second memory cell further includes a second access transistor in which the second region is a source region and a second variable resistor, by connecting a gate of the second access transistor to the second word line and connecting the second variable resistor between a drain of the second access transistor and the third region.

23. The method of arranging a memory cell array of a semiconductor memory device of claim 18 wherein arranging the first memory cell further includes connecting a first selection transistor so that the second region is a source region, connecting a gate of the first selection transistor to the first word line, and connecting a first memory transistor between a drain of the first selection transistor and the first region, and
arranging the second memory cell further includes connecting a second selection transistor so that the second region is a source region, connecting a gate of the second selection transistor to the second word line, and connecting a second memory transistor between a drain of the second selection transistor and the third region.

24. The method of arranging a memory cell array of a semiconductor memory device of claim 23, wherein each of the first and second memory transistors includes a Silicon-Oxide-Nitride-Oxide-Silicon (SONOS) cell.

* * * * *